United States Patent
Ogata et al.

(10) Patent No.: US 11,598,017 B2
(45) Date of Patent: Mar. 7, 2023

(54) METHOD OF PLATING

(71) Applicant: EBARA CORPORATION, Tokyo (JP)

(72) Inventors: Shoichiro Ogata, Tokyo (JP); Gaku Yamasaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 17/160,953

(22) Filed: Jan. 28, 2021

(65) Prior Publication Data

US 2021/0246567 A1 Aug. 12, 2021

(30) Foreign Application Priority Data

Feb. 10, 2020 (JP) .............................. JP2020-020793

(51) Int. Cl.
  *C25D 17/06* (2006.01)
  *C25D 7/12* (2006.01)
  *H01L 21/288* (2006.01)
  *C25D 17/00* (2006.01)

(52) U.S. Cl.
  CPC ........... *C25D 17/004* (2013.01); *C25D 7/123* (2013.01); *C25D 17/001* (2013.01); *C25D 17/06* (2013.01); *H01L 21/2885* (2013.01)

(58) Field of Classification Search
  CPC ............. C25D 17/08; C25D 7/12–123; C25D 17/001; H01L 21/76873; H01L 21/673–67346
  See application file for complete search history.

(56) References Cited

U.S. PATENT DOCUMENTS

2013/0306116 A1* 11/2013 Imai ................. H01L 21/67034
134/95.2

FOREIGN PATENT DOCUMENTS

JP 2008-190044 A 8/2008

OTHER PUBLICATIONS

Morigami et al., Machine Translation, JP 2008-190044 A (Year: 2008).*
Morigami et al., Human Translation, JP 2008-190044 A (Year: 2008).*

* cited by examiner

*Primary Examiner* — Ho-Sung Chung
(74) *Attorney, Agent, or Firm* — BakerHostetler

(57) ABSTRACT

There is provided a method of plating comprising: a process of bringing a sealing portion of a seal provided to prevent a contact of a substrate holder that holds a substrate from coming into contact with a plating solution, into contact with pure water; and a process of detecting a leak of the seal, based on presence or absence of a short circuit of a leak detection electrode placed inside of the substrate holder after the sealing portion is brought into contact with the pure water and before the substrate is brought into contact with a chemical solution.

8 Claims, 8 Drawing Sheets

METHOD OF PLATING

TECHNICAL FIELD

The present disclosure relates to a method of plating.

BACKGROUND ART

A generally employed procedure forms wirings, bumps (salient electrodes) and the like on the surface of a substrate such as a semiconductor wafer or a printed circuit board. An electroplating technique is known as a method of forming such wirings, bumps and the like. A plating apparatus employed for the electroplating technique is provided with a substrate holder that is configured to seal an end face of a circular or polygonal substrate and hold the substrate with a substrate surface (a surface to be plated) exposed. A procedure of plating the substrate surface by such a plating apparatus soaks the substrate holder with the substrate held thereby into a plating solution.

A leak of a seal provided to protect a contact (electrical contact) of the substrate holder from the plating solution is likely to cause a plating failure. It is accordingly desired to detect a leak of the seal of the substrate holder and handle the leak as soon as possible. Japanese Unexamined Patent Publication No. 2008-190044 (Patent Document 1) describes a substrate holder that is provided with conducting wires for leak detection placed inside of the substrate holder and that is configured to detect a shortage between the conducting wires caused by a plating solution and thereby detect a leak.

Related Art Document

Patent Document

Patent Document 1: Japanese Unexamined Patent Publication No. 2008-190044

SUMMARY OF INVENTION

In the configuration of detecting a leak in the plating solution, the substrate held on the occurrence of a leak is generally disposed of. This is because a plating failure is likely to occur in the substrate held on the occurrence of a leak. Even when a plating failure does not occur, the exposure of the substrate to the plating solution makes it difficult to plate the substrate again and make the plated substrate subjected to subsequent processing.

An object of the present disclosure is to solve at least part of the problems described above.

According to one aspect of the present disclosure, there is provided a method of plating comprising: a process of bringing a sealing portion of a seal provided to prevent a contact of a substrate holder that holds a substrate from coming into contact with a plating solution, into contact with pure water; and a process of detecting a leak of the seal, based on presence or absence of a short circuit of a leak detection electrode placed inside of the substrate holder after the sealing portion is brought into contact with the pure water and before the substrate is brought into contact with a chemical solution.

DESCRIPTION OF EMBODIMENTS

The following describes embodiments of the present disclosure with reference to drawings. In the attached drawings, identical or similar components are expressed by identical or similar reference signs. In the explanation of the respective embodiments, overlapping description with regard to the identical or similar components may be omitted. Characteristics and features described in each of the embodiments are applicable to the other embodiments so far as they are not incompatible with each other.

In the description hereof, the term "substrate" includes not only semiconductor substrates, glass substrates, liquid crystal substrates and printed circuit boards but magnetic recording media, magnetic recording sensors, mirrors, optical elements, micromachine elements or partially manufactured integrated circuits, and any other objects to be processed. The substrate may be in any of various shapes including polygonal shapes and circular shapes. Although the expressions such as "front face", "back face", "front", "back", "upper (on, above)", "lower (below)", "left", "right", "vertical" and "horizontal" are used in the description hereof, these expressions only indicate the positions and the directions on the sheet surfaces of the illustrative drawings for the purpose of explanation and may be different from the positions and the directions in the actual layout, for example, during use of the apparatus.

Figure 1:
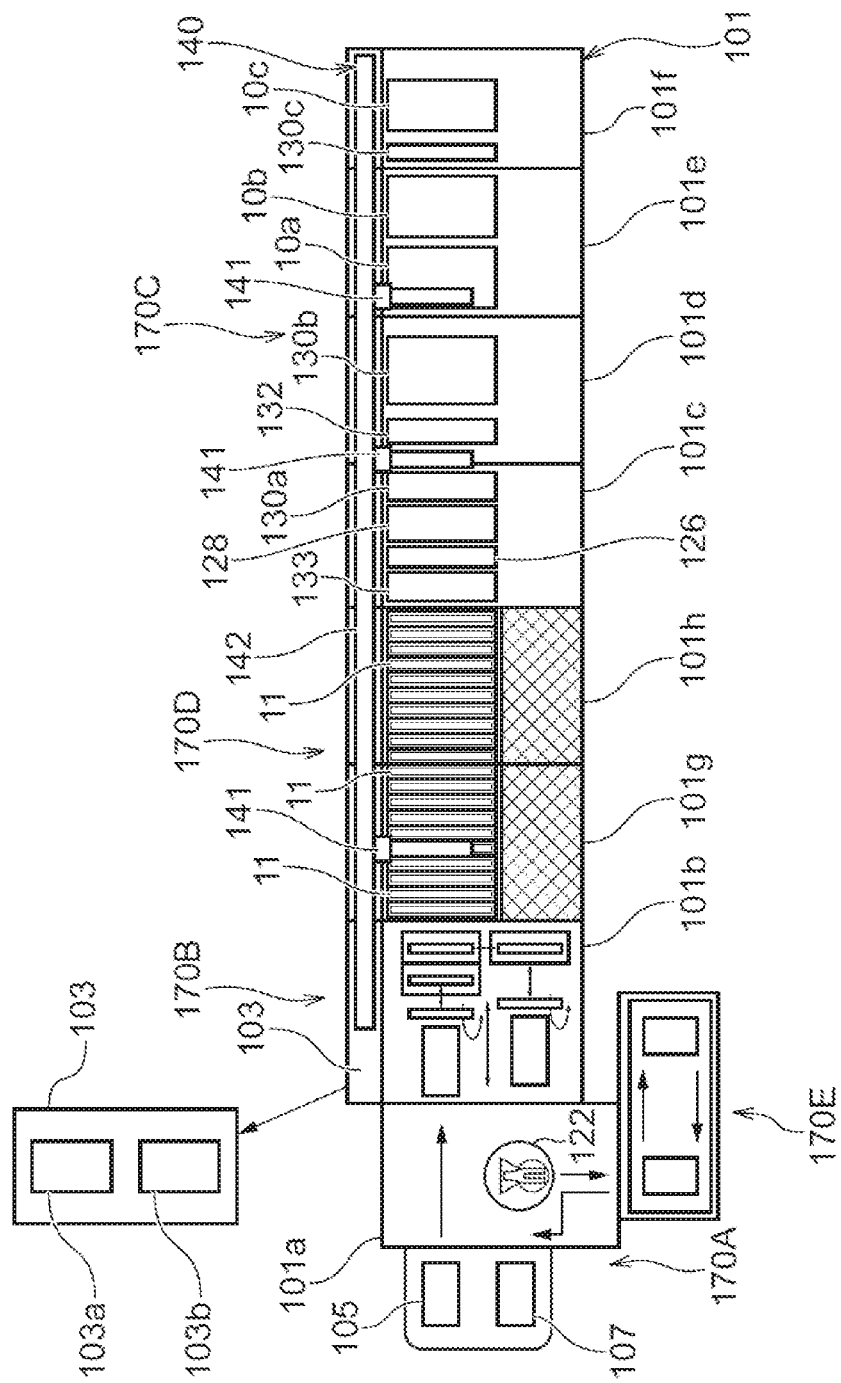
FIG. 1 is a diagram illustrating the general configuration of a plating apparatus according to one embodiment of the present disclosure.

FIG. 1 is a diagram illustrating the general configuration of a plating apparatus according to one embodiment of the present disclosure. The plating apparatus of the embodiment is an electroplating apparatus configured to make electric current flow in a plating solution and thereby plate a first face and a second face of a substrate W with a metal. The first face and the second face are faces opposed to each other and are, for example, a front surface and a rear face. A conductive layer comprised of a seed layer or the like is formed on each of the first face and the second face of the substrate W. Furthermore, a resist layer is formed in a patterned-surface forming area on this conductive layer. Trenches and via holes are formed in advance in this resist layer. According to the embodiment, a substrate having a through hole formed to connect the first face and the second face of the substrate with each other (called a through hole substrate) may be included as an object to be processed. A plating apparatus for double-sided plating is described herein as an example, but the description may also be applicable to a plating apparatus for single-sided plating.

As shown in FIG. 1, the plating apparatus includes a base 101, a controller 103 configured to control the operations of the plating apparatus, a load/unload station 170A configured to load and unload the substrate W, a substrate mounting/demounting station 170B configured to mount the substrate W to a substrate holder 11 (shown in FIG. 2) and demount the substrate W from the substrate holder 11, a processing station 170 configured to plate the substrate, a storage station (stocker) 170D configured to store the substrate holder 11, and a cleaning station 170E configured to clean and dry the plated substrate W.

As shown in FIG. 1, the base 101 is comprised of a plurality of base members 101a to 101h. These base members 101a to 101h are configured to be connectable with each other. The components of the load/unload station 170A are placed on the first base member 101a, and the components of the substrate mounting/demounting station 170B are placed on the second base member 101b. The components of the processing station 170C are placed on the third base member 101c to the sixth base member 101f, and the components of the storage station 170D are placed on the seventh base member 101g and the eighth base member 101h.

The load/unload station 170A is provided with a load stage 105 which a cassette (not shown) placing therein the substrate W prior to plating is mounted on and with an unload stage 107 which a cassette (not shown) receiving the plated substrate W processed by the processing station 170C is mounted on. Furthermore, a transfer robot 122 configured to transfer or convey the substrate W is placed on the load/unload station 170A.

The transfer robot 122 is configured to access the cassette mounted on the load stage 105, to take out the substrate W prior to plating from the cassette and to transfer the substrate W to the substrate mounting/demounting station 170B. The substrate mounting/demounting station 170B mounts the substrate W prior to plating to the substrate holder 11 and demount the plated substrate W from the substrate holder 11.

The processing station 170C includes a pre-wet module 126, a pre-soak module 128, a first rinse module 130a, a blow module 132, a second rinse module 130b, a first plating module 10a, a second plating module 10b, a third rinse module 130c and a third plating module 10c, which are placed therein. In the processing station 170C, a holder cleaning module 133 is placed on a side near to the stocker 170D. In the description below, the first plating module 10a, the second plating module 10b and the third plating module 10c may collectively be called the plating module 10 or any plating module among these plating modules may be referred to as the plating module 10.

The pre-wet module 126 is configured to process the substrate W with degassed pure water as pre-process preparation with a view to improving the wettability of the substrate W to the plating solution. The pre-soak module 128 is configured to remove an oxide film on the surface of a conductive layer such as a seed layer formed on the surface of the substrate W by etching removal using a chemical solution (for example, an acidic solution). The first rinse module 130a, is configured to clean the substrate W after pre-soak with a cleaning liquid (for example, pure water).

At least one plating module 10 out of the first plating module 10a, the second plating module 10b and the third plating module 10c is used to plate both faces or one single face of the substrate W. According to the embodiment shown in FIG. 1, the plating apparatus has three plating modules 10. According to another embodiment, the plating apparatus may have any number of plating modules 10.

The second rinse module 130b is configured to clean the substrate W plated by the first plating module 10a or by the second plating module 10b, along with the substrate holder 11, by using a cleaning liquid (for example, pure water). The third rinse module 130c is configured to clean the substrate W plated by the third plating module 10c, along with the substrate holder 11, by using a cleaning liquid (for example, pure water). The blow module 132 is configured to drain the liquid from the cleaned substrate W before and/or after the plating process. The holder cleaning module 133 is configured to clean the substrate holder 11 without holding the substrate W by using a cleaning liquid (for example, pure water).

The pre-wet module 126, the pre-soak module 128, the rinse modules 130a to 130c and the plating modules 10a to 10c are processing modules respectively provided with tanks to store the respective processing solutions (liquids) inside thereof. The tank of each processing module includes a plurality of processing cells to store the processing solution. The configuration of the processing module is, however, not limited to this configuration of the embodiment. For example, the tank of each of these processing modules may include a single processing cell. In another example, at least part of these processing modules may respectively include a single processing cell, whereas the other processing modules may respectively include a plurality of processing cells.

The plating apparatus further includes a transfer device 140 configured to transfer or convey the substrate holder 11. The transfer device 140 is configured to be movable between the respective components of the plating apparatus. The transfer device 140 includes a stationary base 142 extended horizontally from the substrate mounting/demounting station 170B to the processing station 170C and one or a plurality of transporters 141 configured to be movable along the stationary base 142.

Each of these transporters 141 includes a movable portion (not shown) serving to hold the substrate holder 11 and is configured to hold the substrate holder 11. The transporter 141 is configured to transfer or convey the substrate holder 11 between the substrate mounting/demounting station 170B, the storage station 170D and the processing station 170C and further move up and down the substrate holder 11 along with the substrate W. For example, the transporter 141 serves to move the substrate holder 11 with the substrate W held thereby down from upside of each module to place the substrate W along with the substrate holder 11 inside of each module and/or to bring the substrate W into contact with the processing solution. According to the illustrated embodiment, the plating apparatus is provided with three transporters. According to another embodiment, the plating apparatus may be provided with any number of transporters.

The plating apparatus includes the controller 103 serving as the control module configured to control the respective components described above. The controller 103 includes a memory 103b configured to store predetermined programs, recipes and the like and a CPU 103a configured to execute the programs stored in the memory 103b. A storage medium that constitutes the memory 103b is configured to store, for example, a variety of set data, various programs including programs performed to control the plating apparatus, recipes and the like. The programs include, for example, programs that perform transfer control of the transfer robot 122, control of mounting and demounting the substrate to and from the substrate holder in the substrate mounting/demounting station 170B, transfer control of the transfer device 140, control of the processings in the respective processing modules, control of the plating process in the respective plating modules, and control of the cleaning station 170E. The storage medium may include nonvolatile and/or volatile storage media. The storage medium used may be any of known storage media, for example, a computer readable memory such as a ROM, a RAM or a flash memory or a disk-type storage medium such as a hard disk, a CD-ROM, a DVD-ROM or a flexible disk.

The controller 103 is configured to make communication with a non-illustrated upper level controller that performs integrated control of the plating apparatus and the other relevant devices and to send and receive data to and from a database of the upper level controller. Part or the entirety of the functions of the controller 103 may be configured by a hardware such as ASIC. Part or the entirety of the functions of the controller 103 may be configured by a sequencer. Part or the entirety of the controller 103 may be placed on inside and/or outside of the plating apparatus. Part or the entirety of the components of the controller 103 are connected to make communication with each other and/or to make communication with the respective components of the plating apparatus, by wire or wirelessly.

Substrate Holder

Figure 2:
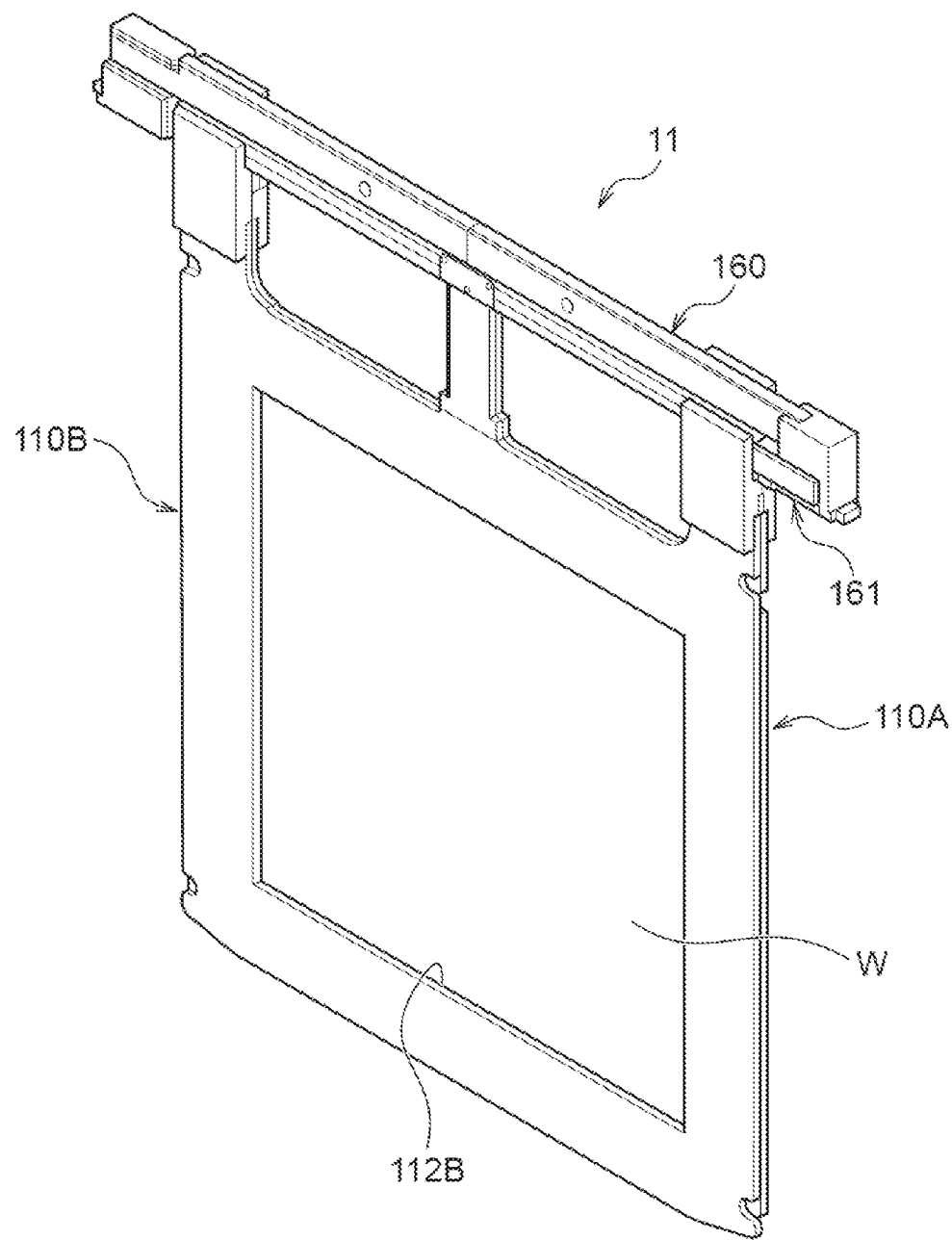
FIG. 2 is a perspective view illustrating a substrate holder.
Figure 3:
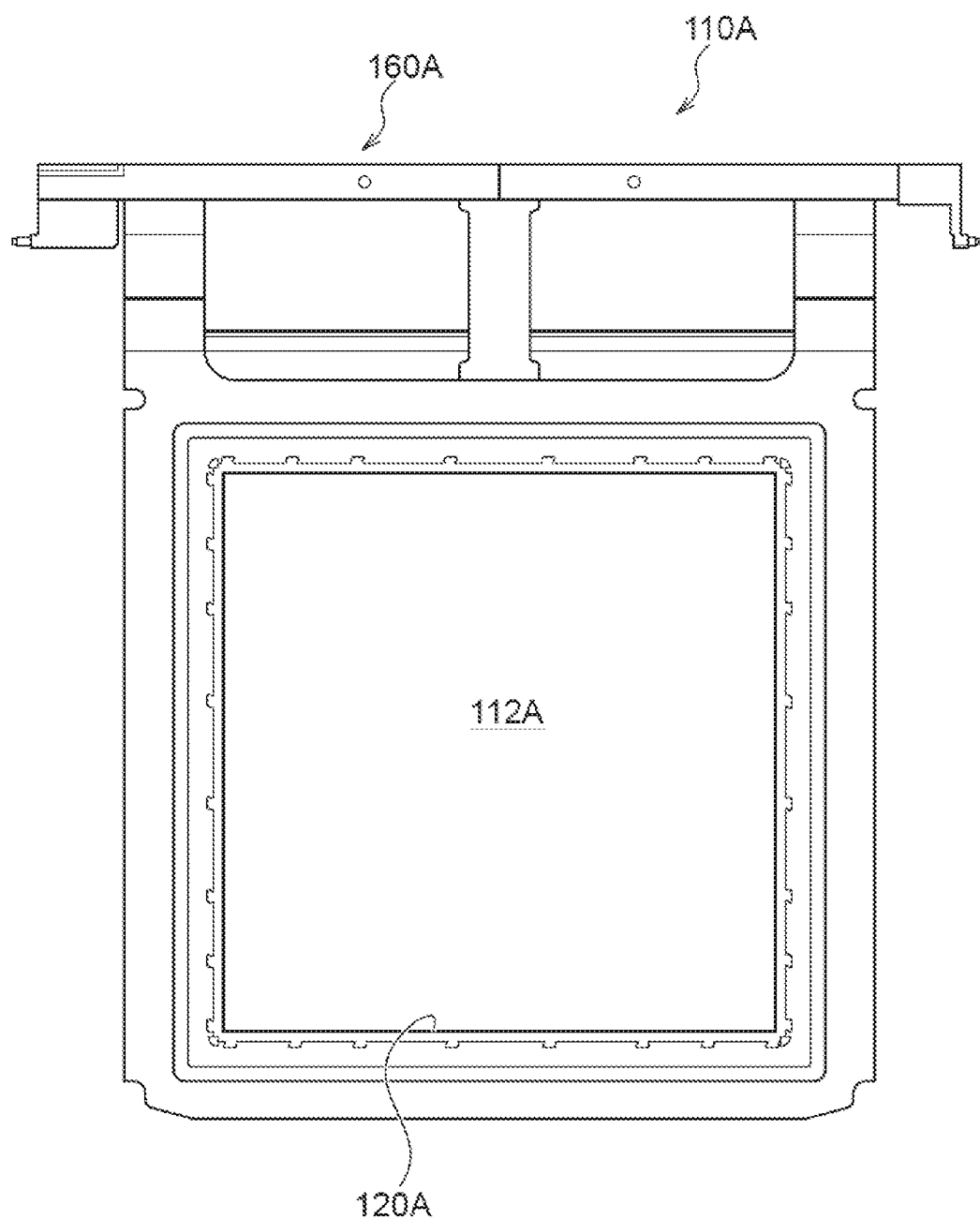
FIG. 3 is an inside plan view illustrating a first holding member of the substrate holder.
Figure 4:
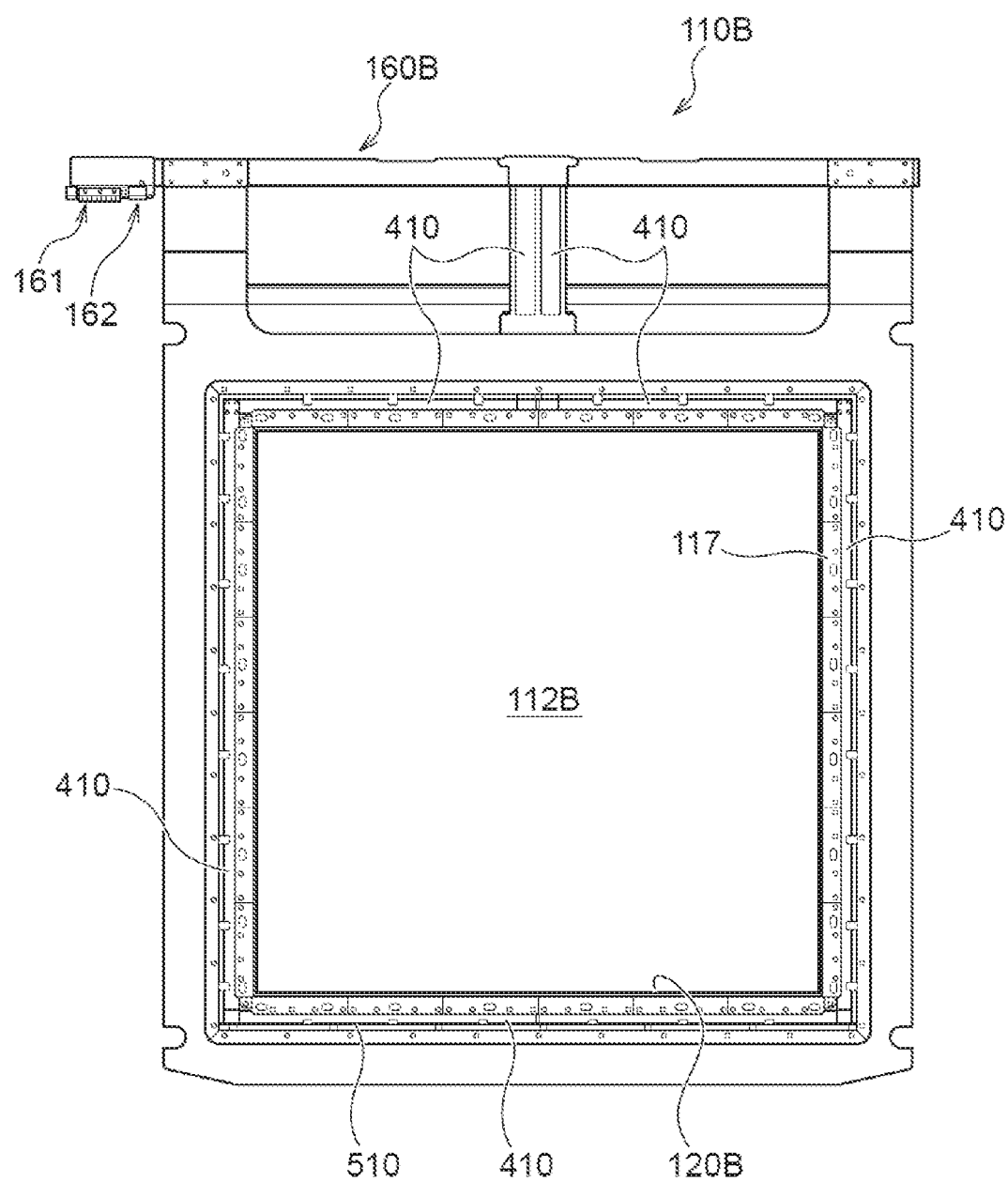
FIG. 4 is an inside plan view illustrating second holding member of the substrate holder.

FIG. 2 is a perspective view illustrating the substrate holder. FIG. 3 is an inside plan view illustrating a first holding member of the substrate holder. FIG. 4 is an inside plan view illustrating a second holding member of the substrate holder.

As shown in FIG. 2, the substrate holder 11 includes a first holding member 110A having an opening 112A (shown in FIG. 3) and a second holding member 110B having an opening 112B (shown in FIG. 4). In the state that the substrate holder 11 does not hold the substrate, the opening 112A and the opening 112B form an opening 112 that passes through the substrate holder 11. The substrate holder 11 is configured to place the substrate W between the first holding member 110A and the second holding member 110B and thereby hold the substrate W. The first holding member 110A and the second holding member 110B hold the substrate W in such a manner that respective surfaces to be plated of the first face and the second face of the substrate W are exposed by the respective openings 112A and 112B. In other words, the first holding member 110A and the second holding member 110B are configured to clamp only an outer circumferential part of the substrate W from the respective sides so as to hold the substrate W. In the case of single-sided plating, one of the openings 112A and 112B may not be provided or may be blocked. The substrate holder 11 includes an arm 160 provided in an upper portion thereof. The substrate holder 11 is transferred or conveyed in such a state that the arm 160 is held by the transporter 141. Respective ends of the arm 160 are placed at an edge of the tank of each module, so that the substrate holder 11 is hung and supported. In the description below, a side where the first face of the substrate W is exposed in the substrate holder 11 may be referred to as a first side, and a side where the second face of the substrate W is exposed may be referred to as a second side. FIG. 2 illustrates the substrate holder 11 viewed from the second side and shows the state that the second face of the substrate W is exposed on the opening 112B of the second holding member 110B.

According to the embodiment, the substrate holder 11 is configured to hold the substrate W in a rectangular shape. The configuration of the substrate holder 11 is, however, not limited to this configuration. The substrate holder 11 may be configured to hold a substrate in a circular shape. In this case, both the opening 112A and the opening 112B are formed in a circular shape. In another example, the substrate W may be a substrate in a polygonal shape other than the rectangular shape. In this case, both the opening 112A and the opening 112B are formed in a corresponding polygonal shape. A substrate holder for double-sided plating is described herein as an example, but the disclosure of the present application may also be applicable to a substrate holder for single-sided plating.

As shown in FIG. 2 and FIG. 4, the second holding member 110B includes an arm portion 160B that forms part of the arm 160. An external connection terminal 161 and an external connection terminal 162 are provided at one end of the arm portion 160B. The external connection terminal 161 is a terminal configured to feed the electric power to the substrate W (corresponding to a conductive member for substrate electric conduction or current flowing through a substrate) and is connected with a power source (for example, a DC power source). The external connection terminal 162 is a terminal used to electrically connect a leak detection electrode 510 with a current sensor 530 (shown in FIG. 7). One or a plurality of bus bars 410 are connected with the external connection terminal 161 for substrate electric conduction. In this illustrated example, two bus bars 410 placed away from each other and parallel to each other are connected with the external connection terminal 161 and are extended along a longitudinal direction inside of the arm portion 160B to the vicinity of the middle of the arm portion 160B and further extended from the arm portion 160B toward the opening 112B. The respective bus bars 410 are extended in mutually opposite directions above the opening 112B, extended along an upper side of the opening 112B, further extended along respective lateral sides of the opening 112B (a right side and a left side in FIG. 4), and extended from the respective sides along a lower side of the opening 112B toward the middle of the lower side. The respective bus bars 410 are placed away from each other in the middle of the lower side of the opening 112B. Before the plating current is made to flow, respective electrodes of the external connection terminal 161 which the respective bus bars are linked with are electrically separated from each other. Placing the two bus bars away from each other enables an electric conduction check to be performed between the two bus bars before the plating current is made to flow. When such an electric conduction check is not performed, the two bus bars 410 may be linked with each other in the middle of the lower side of the opening 112B. An inner seal 120B is provided in the periphery of the opening 112B to seal an outer circumferential part of the second face of the substrate W.

As shown in FIG. 4, in the second holding member 110B, a plurality of contacts 117 as electrical contacts that come into contact with the substrate are placed on an inner side of the bus bars 410, and the respective contacts 117 are electrically connected with the bus bars 410. The contacts 117 may be linked with the bus bars 410 by screwing or by another arbitrary fixing means. An example that the bus bar serves as a conductive path from the external connection terminal 161 to each of the contacts 117 is described herein, but the conductive path may be any conductive material such as a cable or a conducting wire.

In the second holding member 110B, the leak detection electrode 510 is placed outside of the bus bars 410. The leak detection electrode 510 is electrically connected with the external connection terminal 162, is extended along a right lateral side of the opening 112B and further extended along a lower side of the opening 112B from the right lateral side toward a left lateral side in the sheet surface of FIG. 4 and is terminated in the vicinity of a corner between the lower side and the left lateral side. As described later, the leak detection electrode 510 is placed in such a state as to be separated and electrically insulated from the bus bars 410. The leak detection electrode 510 may be provided to be extended from an upper portion (upper side) of the opening 112B to at least midway of a side portion (lateral side), to be extended from the upper portion (upper side) of the opening 112B through the side portion (lateral side) to an arbitrary position in a lower portion (lower side) or to be extended along the entire outer circumference of the opening 112B.

As shown in FIG. 2 and FIG. 3, the first holding member 110A includes an arm portion 160A that forms part of the arm 160. The arm portion 160A of the first holding member 110A is engaged with the arm portion 160B of the second holding member 110B to form the arm 160. An inner seal 120A is provided in the periphery of the opening 112A of the first holding member 110A to seal an outer circumferential part of the first face of the substrate W.

Figure 5:
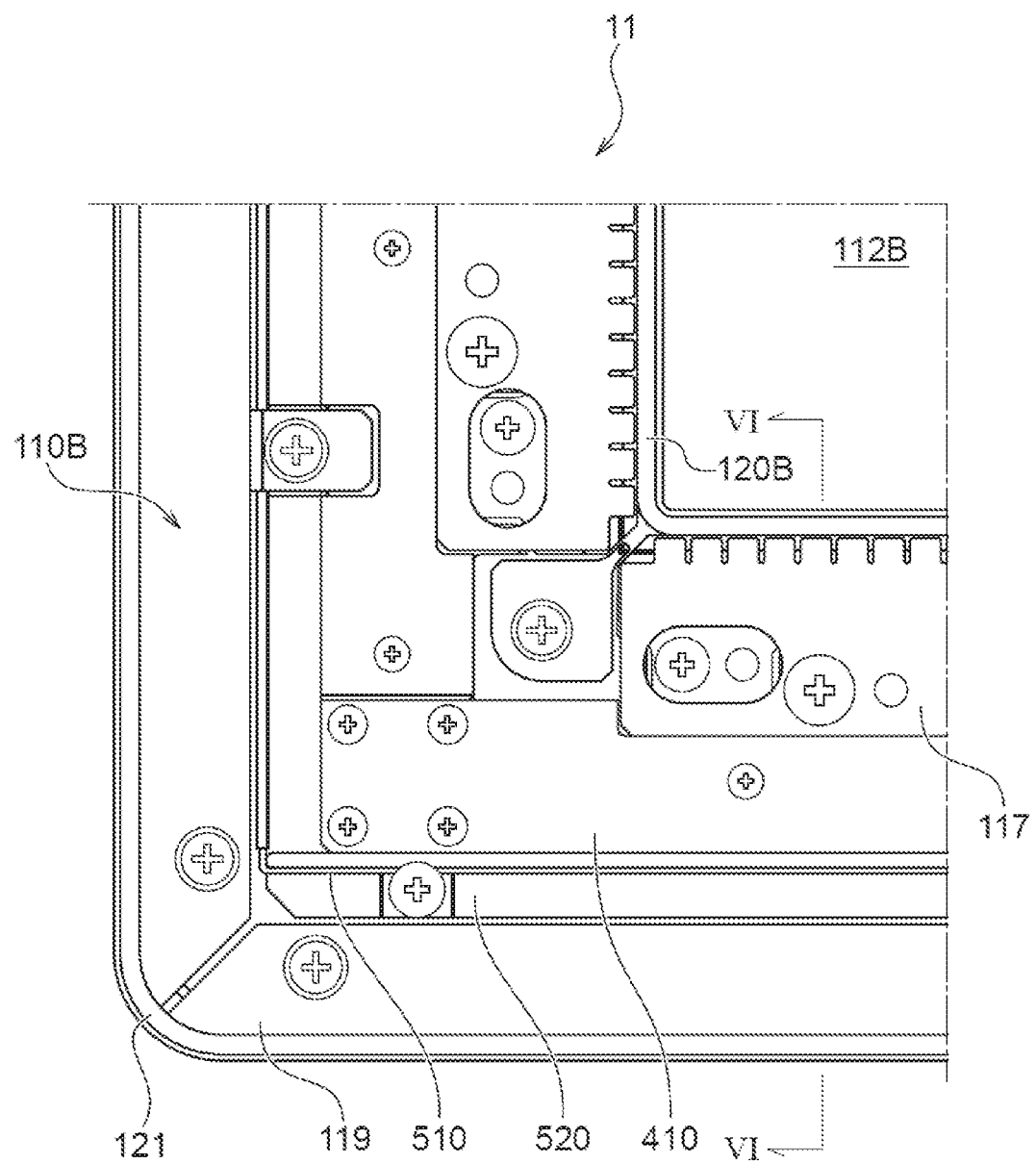
FIG. 5 is a partly enlarged view illustrating an inside face of the second holding member.
Figure 6:
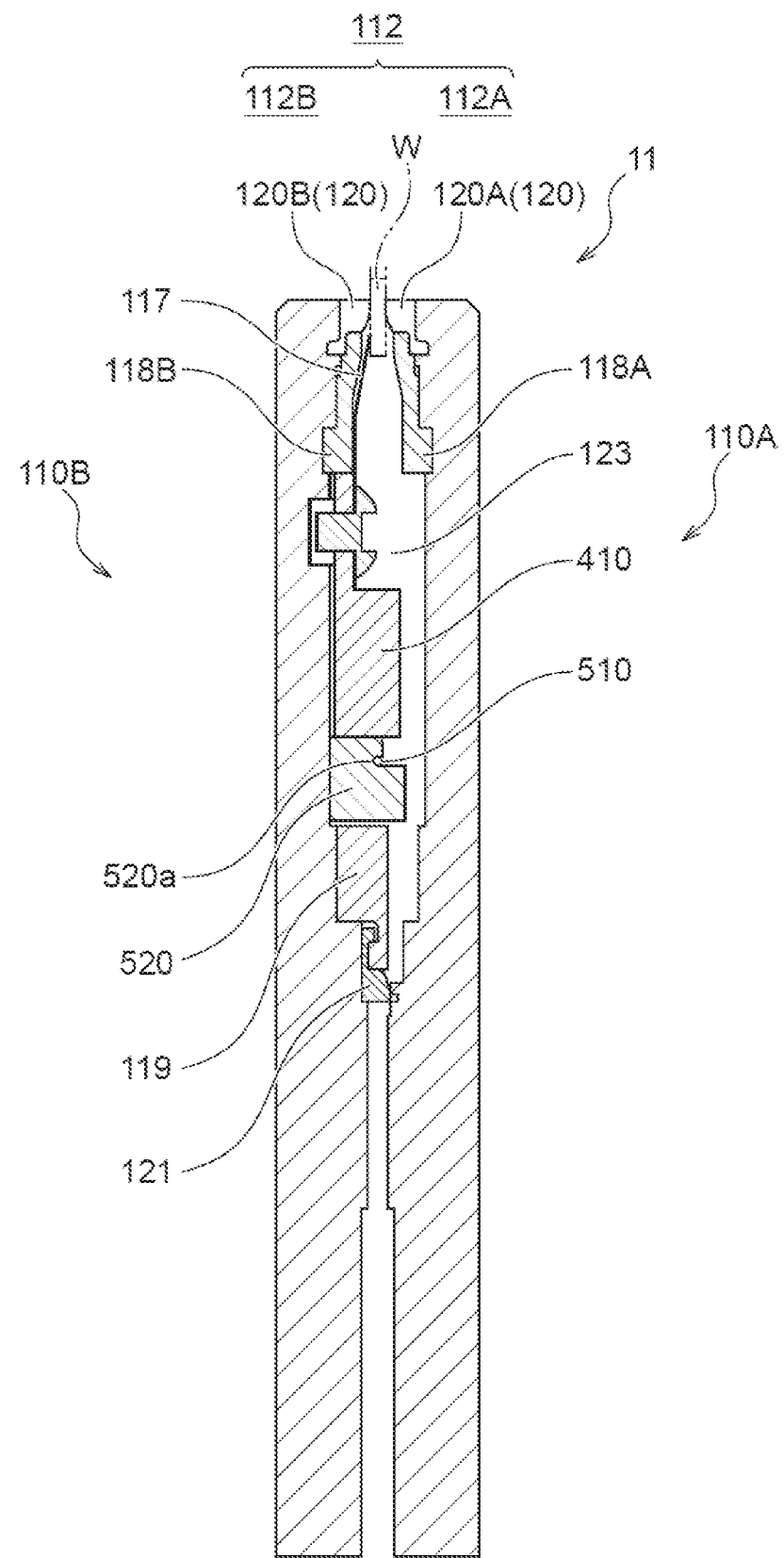
FIG. 6 is a sectional view taken along a line VI-VI in FIG. 5.
Figure 7:
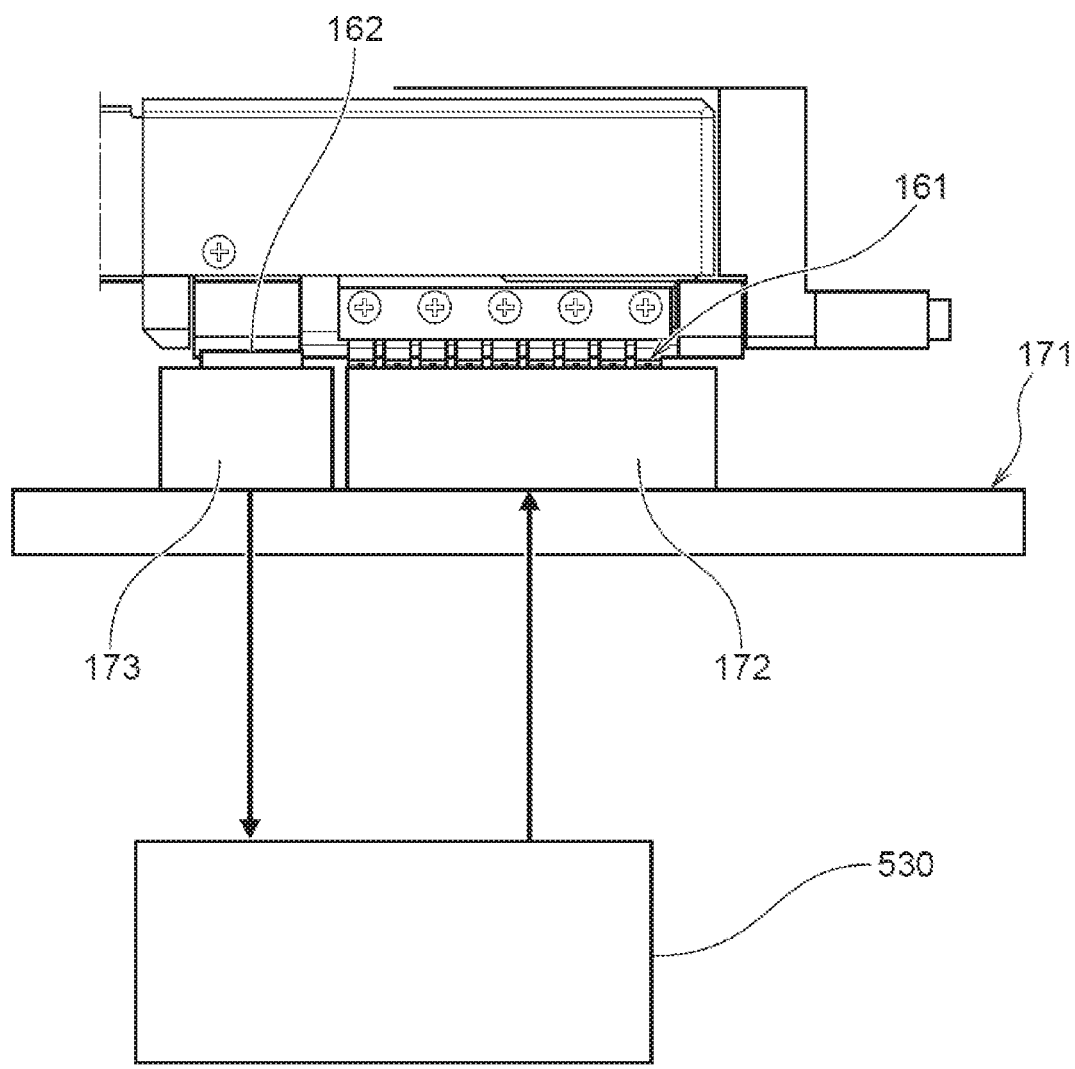
FIG. 7 is an explanatory view illustrating connection of the substrate holder with a sensor.

FIG. 5 is a partly enlarged view illustrating an inside face of the second holding member. FIG. 6 is a sectional view taken along a line VI-VI in FIG. 5. FIG. 7 is an explanatory view illustrating connection of the substrate holder with a sensor. As shown in FIG. 5 and FIG. 6, the inner seal 120B held by a seal holder 118B is provide in the periphery of the opening 112B, and the inner seal 120A held by a seal holder 118A is provided in the periphery of the opening 112A. The inner seals 120A and 120B serve to seal between the substrate holder 11 and the substrate W. More specifically, the inner seal 120B serves to seal between the second holding member 110B and the second face of the substrate W, and the inner seal 120A serves to seal between the first holding member 110A and the first face of the substrate W. A base end side of the contact 117 is mechanically and electrically connected with the bus bar 410 by any fixing means such as screwing. A free end side of the contact 117 is brought into contact with a face of the substrate W to become electrically conductive. As shown in FIG. 6, in the second holding member 110B, an outer seal 121 held by a seal holder 119 is provided on a side away from the opening 112B/on outer side. The outer seal 121 serves to seal between the first holding member 110A and the second holding member 110B. The outer seal 121 may be provided on the first holding member 110A. The inner seal 120 (120A and 120B) and the outer seal 121 form a seal space 123 that blocks and seals the contacts 117 and the leak detection electrode 510 from the processing solution.

A holder 520 is provided adjacent to an outer side of the bus bar 410 to hold the leak detection electrode 510. The holder 520 is provided with a groove 520a extended approximately parallel to the bus bar 410. The leak detection electrode 510 is placed in the groove 520a to be located near to but separated from (not contact with) the bus bar 410 and to be electrically insulated from the bus bar 410. The leak detection electrode 510 is extended along the entire circumference or part of the circumference of the bus bar 410 on the outer circumference of the opening 112B to pass through the arm portion 160B and is electrically connected with the external connection terminal 162.

The leak detection electrode 510 is placed away from the bus bar 410 to be electrically insulated from the bus bar 410. In the case where a liquid such as pure water enters the seal space 123, the leak detection electrode 510 serves to detect the electric current flowing between the leak detection electrode 510 and the bus bar 410 via the liquid such as pure water and thereby detect a leak of the seal (inner seal or outer seal). It is required to place the leak detection electrode 510 in a close distance but separate from the bus bar 410, in order to surely detect a leak of the seal even when only a small amount of the liquid enters the seal space 123.

The leak detection electrode 510 may be a conducting wire made of any conductive material. Part of the conducting wire may be covered with a coat of an electrical insulating material. In the illustrated example of FIG. 4, the conducting wire of the leak detection electrode 510 placed other than the lower side of the opening 112B may be covered with a coat of an electrical insulating material, whereas the conducting wire placed on the lower side of the opening 112B may be exposed. In the case of processing the substrate holder 11 in a vertical attitude, the processing solution leaked through the seal is accumulated in a lower part of the substrate holder 11. Accordingly, in some cases, it may be sufficient to perform the leak detection in the lower part of the substrate holder 11. The conducting wire of the leak detection electrode 510 may be in any shape such as a rod-like shape or a plate-like shape. The conductive wire may have a cross section in any shape such as a circular shape or a polygonal shape.

As shown in FIG. 7, the current sensor 530 is connected with the external connection terminals 161 and 162, which are respectively connected with the bus bar 410 and the leak detection electrode 510, and is configured to detect the minute current flowing between the bus bar 410 and the leak detection electrode 510 via the liquid such as pure water. The pure water has a significantly larger resistance value (about ten-odd MΩ) compared with a chemical solution such as a plating solution. A current sensor configured to detect the minute current via pure water should thus be employed as the current sensor 530. As shown in FIG. 7, the external connection terminal 162 connected with the leak detection electrode 510 is electrically connected with the current sensor 530 via a conductive plate (tap) 173. The external connection terminal 161 connected with the bus bar 410 is electrically connected with the current sensor 530 via a conductive plate (tap) 172. The conductive plates 172 and 173 are placed in a location where an end of the arm 160 of the substrate holder 11 is placed, for example, at an edge of a processing tank in any processing module 171. This processing module 171 includes, for example, the pre-wet module 126, the pre-soak module 128, the first rinse module 130a, the blow module 132, the second rinse module 130b, the first plating module 10a, the second plating module 10b, the third rinse module 130c, and/or the third plating module 10c. The storage station (stocker) 170D may have a similar configuration.

For example, a procedure of leak detection using the leak detection electrode 510 applies a voltage (desirably, an AC voltage) between the bus bar 410 and the leak detection electrode 510 and measures the electric current flowing between the bus bar 410 and the leak detection electrode 510. When there is no leak of the liquid such as pure water, the bus bar 410 and the leak detection electrode 510 are kept electrically insulated from each other, so that no electric current flows between the bus bar 410 and the leak detection electrode 510. When electric conduction is established (when a short circuit occurs) between the bus bar 410 and the leak detection electrode 510 via the liquid such as pure water, on the other hand, electric current flows between the bus bar 410 and the leak detection electrode 510 via the liquid (i.e., there is a variation in resistance in response to an input voltage). A measurement value of the electric current is output from the current sensor 530 to the controller 103. The controller 103 detects a leak, based on predetermined conditions (conditions for detecting the occurrence of a leak from the measured electric current). The conditions for detecting the occurrence of a leak from the measured electric current may be set in advance in the detection sensor 530. The detection sensor 530 may be configured to send a leak signal to the controller 103 when these conditions are satisfied. In this configuration, the controller 103 detects a leak, based on a leak signal sent from the current sensor 530. Detecting a short circuit between the bus bar 410 and the leak detection electrode 510 as described above results in detecting a leak of the seal (the inner seal 120 and/or the outer seal 121).

Figure 8:
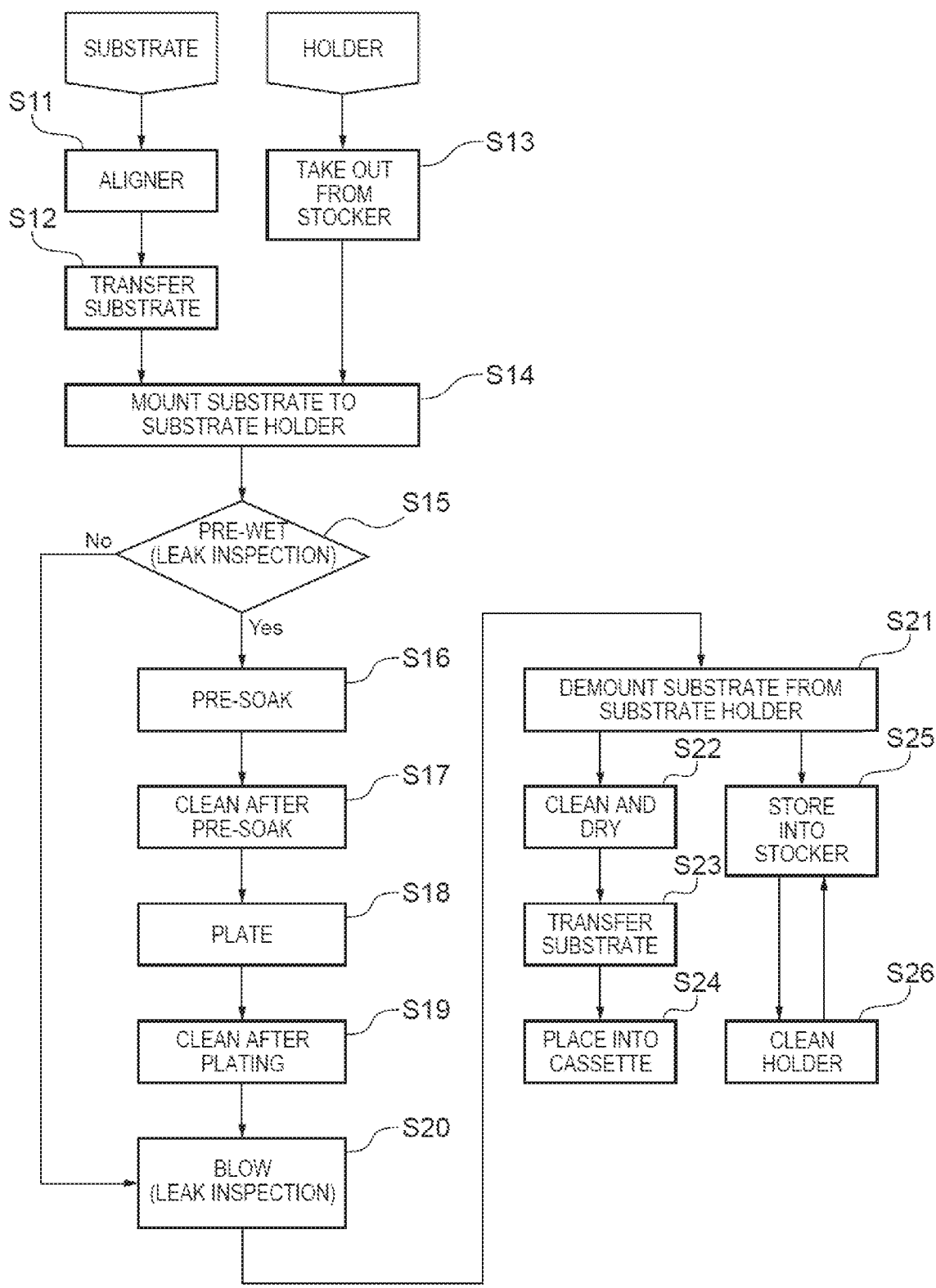
FIG. 8 is a flowchart showing a plating method.

FIG. 8 is a flowchart showing a plating method according to the embodiment. The flowchart of this plating method is performed by the controller 103.

At step S11, a substrate W is taken out from a cassette by the transfer robot 122, and the direction of the substrate W is adjusted by an aligner (not shown) or the like.

At step S12, the substrate W is transferred and carried into the substrate mounting/demounting station 170B by the transfer robot 122.

At step S13, a vacant substrate holder 11 is taken out from the storage station (stocker) 170D and is transferred and carried into the substrate mounting/demounting station 170B by the transporter 141. The processing of step S13 is performed in parallel to the processing of steps S11 and S12.

At step S14, in the substrate mounting/demounting station 170B, the substrate W is mounted to the substrate holder 11 by a fixing device.

At step S15, the substrate holder 11 is transferred or conveyed to the pre-wet module 126 by the transporter 141, and the substrate W is processed with degassed pure water, with a view to improving the wetlability of the substrate W to the plating solution. The pre-wet module 126 may be configured to soak the substrate W and the substrate holder 11 in the stored degassed water or to inject the degassed water from a nozzle onto the substrate W. In this state, a sealing portion of the seal (the inner seal 120 and the outer seal 121 in this example) provided to prevent the contact 117 of the substrate holder 11 from coming into contact with the plating solution is exposed to or brought into contact with pure water. The sealing portion herein denotes a contact portion (contact surface/sealing surface) where the seal comes into contact with a sealed member. The sealing portion includes, for example, a contact surface/sealing surface where the inner seal 120 comes into contact with the substrate W and/or the first holding member 110A/second holding member 110B, and a contact surface/sealing surface where the outer seal 121 comes into contact with the first holding member 110A and/or the second holding member 110B. The leak inspection of the substrate holder 11 described above with reference to FIG. 5 to FIG. 7 is also performed in this pre-wet module 126. More specifically, the degassed water enters the seal space in the case of an inappropriate seal between the inner seal 120 and the substrate W or in the case of an inappropriate seal between the outer seal 121 and the first holding member 110A. When the seal of the substrate holder 11 has no leak, the current sensor 530/the controller 103 do not detect the leak signal (Yes at S15). The substrate W is then transferred or conveyed to a subsequent processing module (the pre-soak module 128 in this example). When the seal of the substrate holder 11 has a leak, on the other hand, the current sensor 530/the controller 103 detect the leak signal (No at S15). The substrate W is then transferred or conveyed to the blow module 132 (S20) with skipping the subsequent processing module and the plating process and the like. After the substrate W is demounted from the substrate holder 11 (S21), the substrate holder 11 is stored in the stocker 170D (S25). The demounted substrate W is cleaned and dried in the cleaning station 170E and is subsequently placed into the cassette by the transfer robot 122 (S22 to S24). The controller 103 records the information on the substrate holder 11 fix which the leak is detected and/or the information on the demounted substrate W. The substrate holder 11 for which the leak is detected may be not used, or may be reused after being cleaned in the holder cleaning module 133.

At step S16, in the pre-soak module 128, an oxide film on the surface of a conductive layer such as a seed layer formed on the surface of the substrate W is removed by etching removal using a chemical solution.

At step S17, in the first rinse module 130a, the substrate W after pre-soak is cleaned by using a cleaning solution (for example, pure water).

At step S18, the substrate W is plated in the first plating module 10a, the second plating module 10b or the third plating module 10c.

At step S19, the substrate W after plating is cleaned along with the substrate holder 11 by using a cleaning solution (for example, pure water) in the second rinse module 130b or in the third rinse module 130c. In the case where the substrate W is plated in a plurality of plating modules, the processing of step S18 and/or step S19 is repeated multiple times with respect to the substrate W.

At step S20, the substrate W after cleaning is subjected to drainage in the blow module 132. At this time, the leak inspection of the substrate holder 11 may be performed as in the pre-wet process (S15). Even when the leak inspection during the pre-wet process fails to detect a very little leak, performing the leak inspection at the stage after the pre-wet process is likely to detect the presence of the liquid accumulated after the pre-wet process due to the leak. In the case of detection of a leak, the controller 103 records the information on the substrate holder 11 for which the leak is detected and/or the information on the demounted substrate W. In place of or in addition to performing the leak inspection at step S20, at step S19 (cleaning after plating) the leak inspection of the substrate holder 11 may be performed as in the pre-wet process (S15).

At step S21, the substrate holder 11 is transferred or conveyed to the substrate mounting/demounting station 170B by the transporter 141, and the substrate W is demounted from the substrate holder 11 in the substrate mounting/demounting station 170B.

The demounted substrate W is transferred and carried into the cleaning station 170E by the transfer robot 122, is cleaned and dried in the cleaning station 170E, and is subsequently placed into the cassette by the transfer robot 122 (S22 to S24).

The substrate holder 11 after demounting of the substrate W is stored into the stocker 170D by the transporter 141 (S25). The substrate holder 11 is transferred or conveyed to the holder cleaning module 133 by the transporter 141 to be cleaned as needed basis and is subsequently stored into the stocker 170D. The holder cleaning module 133 cleans only the substrate holder 11 without holding the substrate W. In the holder cleaning module 133, a seal is not required, and the seal surface of the seal (the inner seal 120 and the outer seal 121) and the contact 117 may be cleaned. More specifically, cleaning water enters the seal space 123. The cleaned substrate holder 11 is subjected to appropriate drainage and is then stored in the stocker 170D. Before a next substrate is mounted and held by the cleaned substrate holder 11, the leak inspection of the substrate holder 11 may be performed. For example, the leak inspection may be performed in the stocker 170D as in the pre-wet process (S15). In place of or in addition to the leak inspection in the stocker 170D, the leak inspection may also be performed in the substrate mounting/demounting station 170B. Confirmation of no short circuit in the leak detection electrode 510 of the substrate holder 11 by using a current sensor results in confirming that the substrate holder 11 is dried and enables the dried substrate 11 after confirmation to be used for processing of a next substrate. This configuration enables a short circuit caused by insufficient drying of the substrate holder 11 after holder cleaning to be distinguished from a short circuit caused by a failure of the seal of the substrate holder 11 described above.

At step S16 and/or step S17 described above, the leak inspection of the substrate holder 11 may be performed as in the pre-wet process (S15). The leak inspections other than that during the pre-wet process (S15) described above may be performed partly or entirely.

Other Embodiments (1) According to the embodiment described above, the leak inspection is performed by detection of a short circuit between the leak detection electrode 510 and the bus bar 410. According to another embodiment, a pair of conductive materials (for example, conducting wires) may he provided as the leak detection electrode 510, and the leak inspection may be performed by detection of a short circuit between the pair of conductive materials.

(2) According to the embodiment described above, the substrate holder 11 is processed in the vertical attitude or the upright state. The description of the above embodiment may be applied to a configuration that processes the substrate holder 11 in a horizontal attitude.

(3) According to the embodiment described above, the leak inspection is performed first in the pre-wet process (S15) by bringing the sealing portion of the substrate holder 11 into contact with pure water. In a configuration that performs preliminary cleaning to clean the substrate W with pure water prior to the pre-wet process (S15), in place of or in addition to the leak inspection in the pre-wet process, the leak inspection may be performed in the preliminary cleaning.

(4) According to another embodiment, the leak inspection may be performed during transfer or conveyance of the substrate holder.

At least the following aspects are provided from the embodiments described above.

According to a first aspect, there is provided a method of plating comprising: a process of bringing a sealing portion of a seal provided to prevent a contact of a substrate holder that holds a substrate from coming into contact with a plating solution, into contact with pure water; and a process of detecting a leak of the seal, based on presence or absence of a short circuit of a leak detection electrode placed inside of the substrate holder after the sealing portion is brought into contact with the pure water and before the substrate is brought into contact with a chemical solution. The shortaee of the leak detection electrode indicates the flow of electric current in the leak detection electrode via the liquid.

The method of plating of this aspect enables a leak to be detected before the substrate is exposed to or brought into contact with the chemical solution and accordingly enables the substrate to be mounted to another substrate holder and to be plated without disposing of the substrate. This configuration reduces the disposal amount of the substrate due to the leak and thereby reduces the cost. This configuration also enables the substrate holder for which the leak is detected not to be used or to be reused after being cleaned.

According to a second aspect, in the method of plating of the first aspect, the process of bringing the sealing portion into contact with the pure water may be performed in a preliminary cleaning process of cleaning the substrate with pure water and/or in a pre-wet process of bringing the substrate into contact with degassed pure water.

The method of plating of this aspect brings the sealing portion into contact with the pure water in the preliminary cleaning process and/or in the pre-wet process. This configuration enables the leak inspection to be performed at an early stage after the substrate is transferred and carried into a processing station.

According to a third aspect, in the method of plating of the second aspect, the process of detecting the leak of the seal may be performed during the preliminary cleaning process and/or the pre-wet process.

The method of plating of this aspect performs the leak inspection at an early stage after the substrate is transferred and carried into a processing station to check whether the substrate holder has a problem of leak. Furthermore, the leak inspection is performed in the preliminary cleaning process and/or in the pre-wet process. This configuration does not require any additional time for the leak inspection and thereby reduces or eliminates the influence on the throughput.

According to a fourth aspect, in the method of plating of the third aspect, the process of detecting the leak of the seal may be further performed in or after a subsequent process that is subsequent to the pre-wet process.

Even when the leak inspection during the pre-wet process fails to detect a very little leak, the method of plating of this aspect performs the leak inspection in or after the subsequent process. This is likely to detect the presence of the liquid accumulated after the pre-wet process due to the leak. This configuration also enables the substrate holder for which the leak is detected not to be used or to be reused after being cleaned.

According to a fifth aspect, in the method of plating of the fourth aspect, the process of detecting the leak of the seal may be further performed after the substrate is plated.

Even when the leak inspection during the pre-wet process fails to detect a very little leak, the method of plating of this aspect performs the leak inspection after the plating process. This is likely to detect the presence of the liquid accumulated after the pre-wet process due to the leak. This configuration also enables the substrate holder for which the leak is detected not to be used or to be reused after being cleaned.

According to a sixth aspect, in the method of plating of any one of the third aspect to the fifth aspect, the process of detecting the leak of the seal may be further performed before the substrate is held by the substrate holder.

The method of plating of this aspect performs the leak inspection of the substrate holder, for example, in a stocker or in a substrate mounting/demounting station, before the substrate is held by the substrate holder (before a first substrate is held by the substrate holder or before a substrate is demounted from the substrate holder and a next substrate is held by the substrate holder). This configuration can determine whether a seal space of the substrate holder is dried or not. The seal space is a part that is hardest to be dried in the substrate holder. Determining that the seal space has been dried can thus confirm that the substrate holder is dried. This configuration enables the substrate to be mounted to the substrate holder after confirming that the substrate holder is dried.

According to a seventh aspect, the method of plating of the sixth aspect may further comprise a process of cleaning the substrate holder. The process of detecting the leak of the seal may be further performed after the substrate holder is cleaned and before a next substrate is held by the cleaned substrate holder.

The method of plating of this aspect performs the leak inspection of the substrate holder after the substrate holder is cleaned and before a next substrate is held by the substrate holder. This configuration can determine whether the seal space of the substrate holder is dried or not. This configuration enables the substrate to be mounted to the substrate holder after confirming that the substrate holder is dried.

According to an eighth aspect, in the method of plating of any one of the first aspect to the seventh aspect, the leak detection electrode may be placed in a neighborhood of a conductive member for substrate electric conduction of the substrate holder to be electrically insulated from the conductive member. The process of detecting the leak of the seal may detect the leak of the seal by utilizing a short circuit between the leak detection electrode and the conductive member caused by presence of pure water. The conductive member includes a feeder wire (cable, bus bar), a contact, and/or a conductive member that is electrically connected with the feeder wire or the contact.

The method of plating of this aspect detects a leak by utilizing the conductive member that is originally provided in the substrate holder. This configuration accordingly simplifies the structure of the leak detection electrode and saves the space. This configuration also suppresses or prevents an increase in size of the substrate holder.

According to a ninth aspect, in the method of plating of any one of the first aspect to the seventh aspect, the leak detection electrode may include a pair of electrodes placed away from each other, and the process of detecting the leak of the seal may detect the leak of the seal by utilizing a short circuit between the pair of electrodes caused by presence of pure water.

The method of plating of this aspect can detect a leak, while reducing/eliminating the influence of, for example, the electric conduction state of another electric component of the substrate holder.

According to a tenth aspect, in the method of plating of any one of the first aspect to the ninth aspect, the leak detection electrode may be provided along an outer circumference of the substrate and may be extended from an upper portion of the substrate to at least middle of a side portion, extended from an upper portion of the substrate through the side portion to a lower portion, or extended along an entire circumference of the substrate, in a state that the substrate is held by the substrate holder.

In the case where the substrate holder is transferred or conveyed and processed in the upright state or the vertical attitude, employing the configuration that the leak detection electrode is extended to at least the middle of the side portion of the substrate enables the leak inspection to be performed by the leak detection electrode and reduces or prevents misdetection after the substrate holder is cleaned.

In the case where the substrate holder is transferred or conveyed and processed in the upright state or the vertical attitude, the leaking liquid is likely to be accumulated in the lower portion of the substrate holder. Employing the configuration that the leak detection electrode is extended to the lower portion of the substrate enhances the accuracy of the leak detection.

The configuration that the leak detection electrode is extended along the entire circumference of the substrate enables a leak to be detected at any position corresponding to the entire circumference of the substrate. This configuration also enhances the accuracy of the leak detection, irrespective of the attitude of the substrate holder.

Although the embodiments of the present invention have been described based on some examples, the embodiments of the invention described above are presented to facilitate understanding of the present invention, and do not limit the present invention. The present invention can be altered and improved without departing from the subject matter of the present invention, and it is needless to say that the present invention includes equivalents thereof. In addition, it is possible to arbitrarily combine or omit respective constituent elements described in the claims and the specification in a range where at least a part of the above-mentioned problem can be solved or a range where at least a pan of the effect is exhibited.

The present application claims priority from the Japanese patent application No. 2020-020793 filed on Feb. 10, 2020. The entire disclosure of the Japanese patent application No. 2020-020793 filed on Feb. 10, 2020, including the specification, the claims, the drawings and the abstract is incorporated herein by reference in its entirety. The entire disclosures of Japanese Unexamined Patent Publication No. 2008-190044 (Patent Document 1), including the specifications, the claims, the drawings and the abstracts are incorporated herein by reference in their entireties.

REFERENCE SIGNS LIST 10 plating module
10a-10c first to third plating modules
11 substrate holder
101 base
103 controller
103a CPU
103b memory
105 load stage
110A first holding member
110B second holding member
112, 112A, 112B openings
117 contact
118A, 118B, 119 seal holders
120A, 120B, 120 inner seals
121 outer seal
122 transfer robot
123 seal space
126 pre-wet module
128 pre-soak module
130a-130c first to third rinse modules
132 blow module
133 holder cleaning module
140 transfer device
141 transporter
142 stationary base
160 arm
160A, 160B arm portions
161, 162 external connection terminals
170A load/unload station
170B substrate mounting/demounting station
170C processing station
170D storage station (stocker)
170E cleaning station
172, 173 conductive plates
410 bus bar
510 leak detection electrode
520 bolder
520a groove
530 current sensor

What is claimed is:

1. A method of plating, comprising
a process of bringing a sealing portion of a seal into contact with pure water, the seal preventing a contact of a substrate holder that holds a substrate from coming into contact with a plating solution; and
a process of detecting a leak of the seal based on presence or absence of a short circuit of a leak detection electrode placed inside of the substrate holder, the process of detecting occurring after the sealing portion is brought into contact with the pure water and before the substrate is brought into contact with the plating solution
wherein the leak detection electrode is placed in a neighborhood of a conductive member for substrate electric conduction in order to be electrically insulated from the conductive member, and
the process of detecting the leak of the seal detects the leak of the seal by utilizing a short circuit between the leak detection electrode and the conductive member caused by presence of pure water.

2. The method of plating according to claim 1,
wherein the process of bringing the sealing portion into contact with the pure water is performed in a preliminary cleaning process of cleaning the substrate with pure water and/or in a pre-wet process of bringing the substrate into contact with degassed pure water.

3. The method of plating according to claim 2,
wherein the process of detecting the leak of the seal is performed during the preliminary cleaning process and/or the pre-wet process.

4. The method of plating according to claim 3,
wherein the process of detecting the leak of the seal is further performed in or after a subsequent process that is subsequent to the pre-wet process.

5. The method of plating according to claim 4,
wherein the process of detecting the leak of the seal is further performed after the substrate is plated.

6. The method of plating according to claim 3,
wherein the process of detecting the leak of the seal is further performed before the substrate is held by the substrate holder.

7. The method of plating according to claim 6, further comprising:
a process of cleaning the substrate holder, wherein
the process of detecting the leak of the seal is further performed after the substrate holder is cleaned and before a next substrate is held by the cleaned substrate holder.

8. The method of plating according to claim 1,
wherein the leak detection electrode is provided along an outer circumference of the substrate and is extended from an upper portion of the substrate to at least middle of a side portion, extended from an upper portion of the substrate through the side portion to a lower portion or extended along an entire circumference of the substrate, in a state that the substrate is held by the substrate holder.

* * * * *